(12) United States Patent
Woolsey et al.

(10) Patent No.: US 6,413,878 B1
(45) Date of Patent: Jul. 2, 2002

(54) METHOD OF MANUFACTURING ELECTRONIC COMPONENTS

(75) Inventors: Eric J. Woolsey, Chandler; Douglas G. Mitchell; George F. Carney, both of Tempe; Francis J. Carney, Jr., Gilbert; Cary B. Powell, Tempe, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,595

(22) Filed: Apr. 10, 2000

Related U.S. Application Data

(62) Division of application No. 09/124,776, filed on Jul. 30, 1998.

(51) Int. Cl.[7] .............................. H01L 21/00; C23F 1/00
(52) U.S. Cl. ...................... 438/754; 216/100; 252/79.4; 438/745
(58) Field of Search ............................... 252/79.2, 79.4; 216/13, 14, 17, 18, 39, 100, 105; 438/701, 1 L, 745, 751, 754

(56) References Cited

U.S. PATENT DOCUMENTS

| | | |
|---|---|---|
| 4,787,958 A | 11/1988 | Lytle |
| 4,814,293 A | 3/1989 | Van Oekel |
| 5,211,807 A | 5/1993 | Yee |
| 5,290,361 A | 3/1994 | Hayashida et al. |
| 5,419,808 A | 5/1995 | Kitano |
| 5,462,638 A | 10/1995 | Datta et al. |
| 5,468,343 A | 11/1995 | Kitano |
| 5,620,611 A | 4/1997 | Datta et al. |
| 5,624,874 A | 4/1997 | Lim et al. |
| 5,773,359 A | 6/1998 | Mitchell et al. |
| 5,962,384 A | 10/1999 | Cooper et al. |

FOREIGN PATENT DOCUMENTS

WO    WO 99/60448    11/1999

OTHER PUBLICATIONS

Konrad Parker, "The Formulation of Electroless Nickel-Phosphorus Plating Baths", Plating and Surface Finishing, pp. 80–85, Feb. 1987.
Konrad Parker, "The Formulation of Electroless Nickel-Phosphorus Plating Baths", Plating and Surface Finishing, pp. 80–85, Feb. 1987.

*Primary Examiner*—William A. Powell

(57) ABSTRACT

A method of manufacturing electronic components includes disposing a top metal layer (502) comprised of solder over a bottom metal layer (201, 202) comprised of titanium or tungsten, and selectively etching the bottom metal layer (201, 202) over the top metal layer (502) with an etchant mixture (601) comprised of an etchant, an additive to control the temperature of the etchant mixture (601), and another additive to reduce the redeposition of the top layer (502).

11 Claims, 2 Drawing Sheets

METHOD OF MANUFACTURING ELECTRONIC COMPONENTS

This application is a divisional application of U.S. Ser. No. 09/124,776, filed Jul. 30, 1998.

BACKGROUND OF THE INVENTION

This invention relates, in general, to electronics, and more particularly, to methods of manufacturing electronic components.

Metal layers of titanium and tungsten are commonly used as barrier layers in electronic components. In particular, semiconductor components use these barrier layers to prevent metallic ions from diffusing into and contaminating the underlying semiconductor substrate. Hydrogen peroxide has been used to etch these barrier layers for over twenty-eight years. Many improvements have been made to the hydrogen peroxide etch process. However, the etch process is still difficult to control in certain situations.

Accordingly, a need exists for an improved method of etching metal layers to manufacture electronic components.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
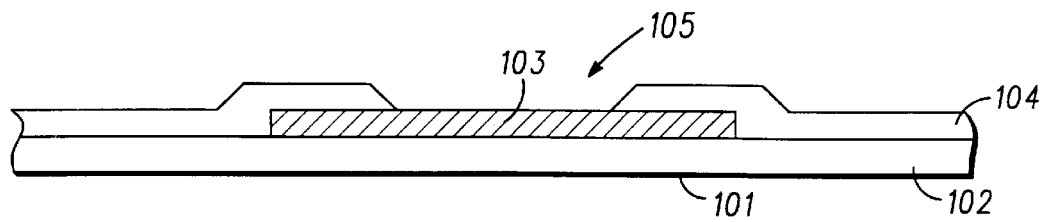
FIG. 1 illustrates a cross-sectional view of an embodiment of a portion of an electronic component in accordance with the present invention.

FIG. 1 illustrates a cross-sectional view of a portion of an electronic component 100. Component 100 includes a substrate 101. Substrate 101 can support a semiconductor device, which is indicated generally by element 102 in FIG. 1. The semiconductor device can be formed in substrate 101 using manufacturing techniques known in the art. For instance, the semiconductor device can be a diode, transistor, integrated circuit, or the like. Substrate 101 can be comprised of a semiconductor substrate and can also include overlying electrically conductive layers and electrically insulative layers for proper electrical wiring and isolation of different portions of the semiconductor device. Substrate 101 can also represent a semiconductor wafer containing a plurality of semiconductor devices.

An example of some of the electrically conductive layers and electrically insulative layers of substrate 101 can include layers 103 and 104, respectively. Layer 103 can be an bonding pad that overlies and is electrically coupled to the semiconductor device in substrate 101. Layer 104 can be a passivation layer that overlies and protects substrate 101, the semiconductor device, and layer 103. Layer 103 can be comprised of aluminum (Al), copper (Cu), or the like, and layer 104 can be comprised of silicon dioxide, silicon nitride, or the like. Layer 104 has a hole 105 overlying and exposing a central portion of layer 103. Hole 105 can be formed in layer 104 by masking and etching processes known in the art.

Figure 2:
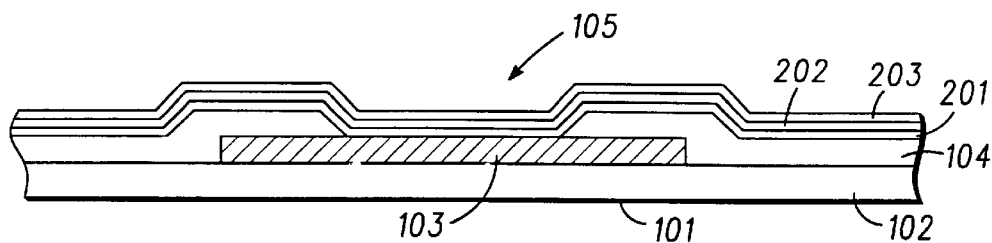
FIGS. 2–7 illustrate cross-sectional views of the embodiment of the portion of the electronic component after subsequent manufacturing steps in accordance with the present invention.

FIG. 2 illustrates a cross-sectional view of component 100 after a composite metal layer is provided over layers 103 and 104. In particular, a metal layer 201 is disposed or deposited in hole 105 to contact the exposed portion of layer 103. Then, a metal layer 202 is disposed or deposited over layer 201, and a metal layer 203 is disposed or deposited over layer 202. Layers 201 and 202 are preferably barrier layers for reasons explained hereinafter, and layer 203 is preferably a seed layer for a subsequent plating step. All of layers 201, 202, and 203 can be sequentially sputtered in-situ to thicknesses of approximately seventy nanometers (nm), approximately two hundred nm, and approximately five hundred nm, respectively. As an example, layer 203 can be comprised of a solderable metal, which is preferably comprised of Cu. Additionally, layer 201 is preferably comprised of titanium tungsten nitride (TiWNx), and layer 202 is preferably comprised of titanium tungsten (TiW). In the preferred embodiment where layer 203 is comprised of Cu, two barrier layers are used because the TiWNx of layer 201 provides better stress relief and better diffusion barrier properties than the TiW of layer 202 and because the Cu of layer 203 adheres better to the TiW of layer 202 than to the TiWNx of layer 201. The TiWNx of layer 201 and the TiW of layer 202 adhere well to each other.

Figure 3:
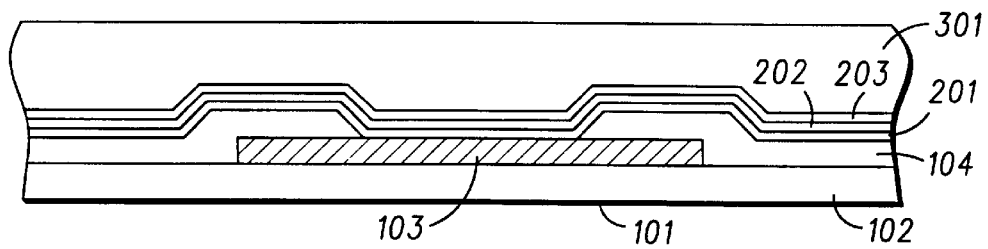
Figure 4:
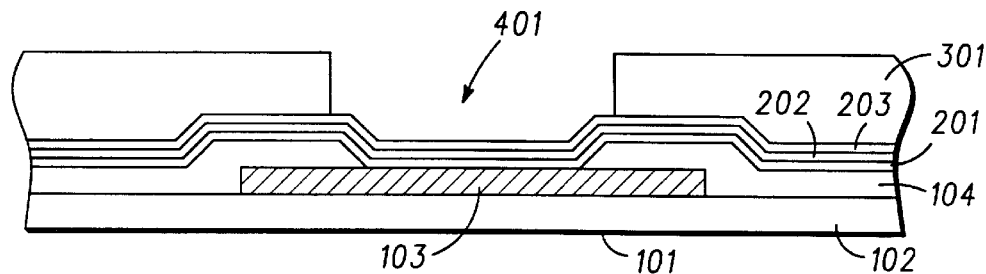

FIGS. 3 and 4 illustrate cross-sectional views of component 100 after subsequent manufacturing steps. In FIG. 3, a mask 301 is formed over layers 201, 202, and 203. In the preferred embodiment, mask 301 is comprised of photoresist. In FIG. 4, an opening 401 is formed in mask 301 to expose a central portion of layer 203. Opening 401 can be easily formed by developing the photoresist.

Figure 5:
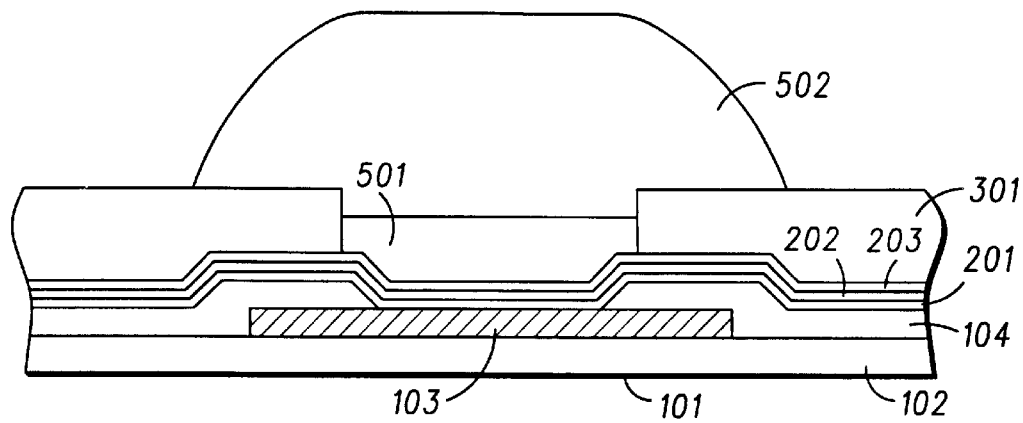

FIG. 5 illustrates a cross-sectional view of component 100 after subsequent manufacturing steps. A metal layer 501 is disposed or deposited in hole 401 of mask 301 to contact layer 203, and a metal layer 502 is disposed or deposited over layer 501. Layer 501 can be plated over layer 203 using electroplating techniques known in the art. Similarly, layer 502 can be plated over layer 501 using techniques known in the art. Layer 501 is preferably plated to a thickness less than the thickness of mask 301. As an example, layer 501 can be plated to a thickness of approximately nine to fifty micrometers, and layer 502 can be plated to a thickness of approximately twenty-five to seventy-five micrometers above mask 301. Layer 501 is preferably comprised of a material different from layers 201 and 202, but similar to layer 203. Layer 502 is preferably comprised of a tin (Sn) and lead (Pb) solder.

Mask 301 prevents layers 501 and 502 from being plated over substantial portions of layer 203 that are covered by mask 301. Therefore, layers 501 and 502 are absent over portions of layers 201, 202, and 203 that underlie mask. 301. The plating of layers 501 and 502 enables the formation of smaller geometry or fine pitch contact bumps compared to the screen printing techniques of the prior art.

Figure 6:
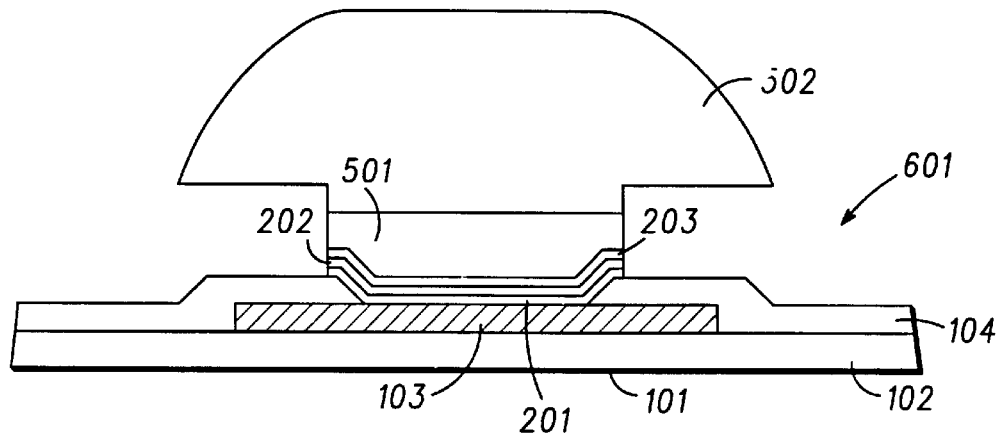

FIG. 6 illustrates a cross-sectional view of component 100 after subsequent manufacturing steps. First, mask 301 of FIGS. 3, 4, and 5 is removed using techniques known in the art. Then, the exposed portion of layer 203 is removed using etching techniques known in the art.

Next, the portions of layers 201 and 202 located underneath the removed portion of layer 203 are removed using an etchant mixture 601. Layers 203, 501, and 502 are also simultaneously exposed to mixture 601 during the etching of layers 201 and 202. However, mixture 601 preferably selectively etches layers 201 and 202 over layers 203, 501, and 502. This etching step can be accomplished in a bath, a spray, or the like of mixture 601.

In the prior art, an etchant consisting solely of thirty percent by weight hydrogen peroxide ($H_2O_2$) would be used to perform this etching step. However, when layer 502 is comprised of Pb and when layer 501 is comprised of Cu, several problems occur when using this prior art etchant. First, the temperature of the prior art etchant rapidly increases due to the catalytic decomposition of the $H_2O_2$ when exposed to the Pb and Cu of layers 501 and 502, respectively. This rise in temperature uncontrollably increases the etch rate of layers 201 and 202. Second, portions of layers 201 and 202 are covered by the redeposition of Pb from layer 502. This redeposition masks the underlying portions of layers 201 and 202 and prevents the etching of those portions.

Etchant mixture 601 is different from the etchant of the prior art. Mixture 601 includes a wet etchant of $H_2O_2$ to selectively etch layers 201 and 202 over layers 203, 501, and 502. When layer 502 is comprised of Pb, mixture 601 can include an additive to suppress the redeposition of the Pb onto layer 202. As an example, this additive can be comprised of Ethylene Dinitrilo Tetraacetic Acid (EDTA). Plain EDTA can be used in mixture 601, but EDTA tetrasodium salt dihydrate (EDTA-$Na_4$—$2H_2O$) is preferred because EDTA-$Na_4$—$2H_2O$ is more soluble in $H_2O_2$ than EDTA. EDTA disodium salt dihydrate (EDTA-$Na_2$—$2H_2O$) is another form of EDTA that can also be used in mixture 601, but when layer 501 is comprised of Cu, EDTA-$Na_2$—$2H_2O$ is not preferred because of the resulting higher Cu etch rate compared to when plain EDTA or EDTA-$Na_4$—$2H_2O$ is used. This higher Cu etch rate produces a large undercut of layers 501 and 203 and can create reliability and other problems. To further reduce the redeposition of Pb, layer 502 preferably has a low content of Pb that is less than approximately fifty-percent by weight of layer 502.

Mixture 601 can also include another additive to stabilize the temperature of mixture 601 and to reduce the decomposition of $H_2O_2$ during the etching of layers 201 and 202. As an example, this other additive can be comprised of 1,2-Diamino Cyclohexane Tetraacetic Acid (DCTA), which is also known as 1,2-cyclohexylenedinitrilo tetraacetic acid. As an example of a specific type of DCTA, DCTA monohydrate (DCTA-$H_2O$) can be used in mixture 601.

As used in the art, the term "pH" represents the acidity or basicity of a solution or mixture. A pH value of 1 indicates an extremely acidic solution, and a pH value of 14 indicates an extremely basic solution. A thirty percent by weight solution of $H_2O_2$ has a pH value of approximately 4. For the most efficient and most stable etching of layers 201 and 202, mixture 601 also preferably has a pH value of approximately 4. However, when EDTA is added to mixture 601, the pH value of mixture 601 may increase. Furthermore, when DCTA is added to mixture 601, the pH value of mixture 601 decreases. Therefore, the amounts of EDTA and DCTA that are added to mixture 601 preferably return the pH value of mixture 601 to approximately 4.

To balance all of the criteria described hereinabove, approximately one to thirty grams of DCTA and approximately one to fifty grams of EDTA can be added to approximately thirty-four liters of thirty percent by weight $H_2O_2$. In the preferred embodiment optimizing all of the criteria, mixture 601 has a ratio of approximately twenty and four-tenths grams of DCTA to approximately six and eight-tenths grams of EDTA to approximately thirty-four liters of thirty-percent by weight $H_2O_2$. Mixture 601 is preferably a homogenous solution, but mixture 601 does not need to be continuously agitated or stirred during the etching process. In fact, mixture 601 preferably is not continuously agitated during the etching process in order to extend the usable life of mixture 601.

To increase the etch rate of mixture 601, mixture 601 can be heated to a temperature above room temperature. In particular, mixture 601 can be heated to approximately sixty to ninety degrees Celsius. The higher temperature produces a higher etch rate for layers 201 and 202. For example, the etch rate is twice as high at seventy degrees Celsius compared to sixty degrees Celsius. However, mixture 601 evaporates at higher temperatures, which disrupts the preferred ratios of the components of mixture 601 and the pH value of mixture 601. Low temperatures of mixture 601 lower the etch rate and require longer etch times, which reduce reduces the throughput of the etch process. The low temperatures of mixture 601 also increases the exposure of layer 502 to mixture 601, and the increased expos-re oxidizes layer 502 when layer 502 is comprised of Sn and Pb. In some cases, this oxidation of layer 502 can be eliminated during a subsequent solder fluxing step, but the oxidation of layer 502 is preferably kept to a minimum. Optimizing these factors, mixture 601 is preferably used at a temperature of approximately seventy degrees Celsius to produce a TiWNx/TiW etch rate of approximately twenty-three nanometers per minute, which is significantly and substantially higher than the etch rate for layers 203, 501, and 502.

Figure 7:
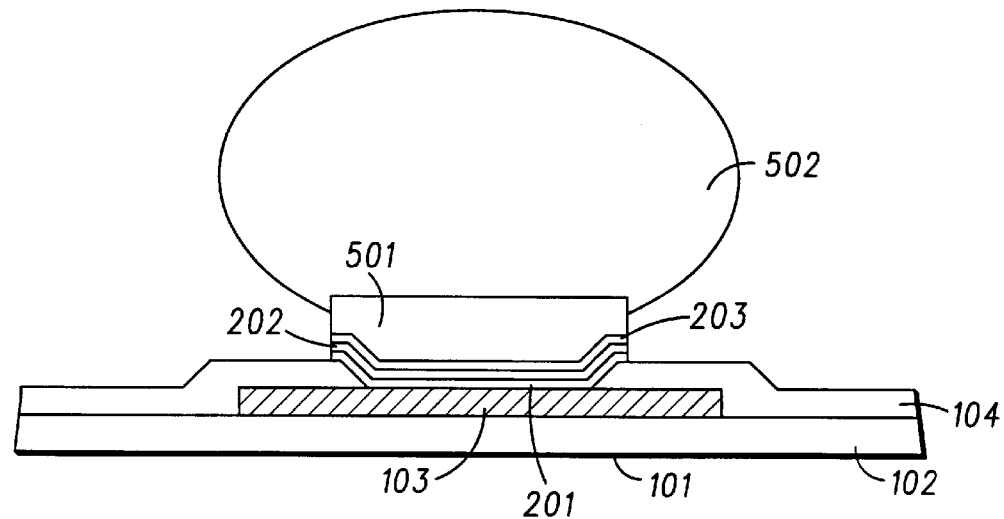

FIG. 7 illustrates a cross-sectional view of component 100 after reflowing layer 502. This reflowing step reshapes layer 502 into a sphere-like object having a diameter of approximately eighty to two hundred micrometers. This curved shape of layer 502 facilitates the coupling of the substrate or device to a leadframe, grid array, or the like. Layer 502 is preferably comprised of a low temperature solder such as, for example, sixty percent Sn and forty percent Pb. The low temperature solder facilitates the assembly of the substrate or device onto a leadframe.

Therefore, an improved method of manufacturing an electronic component is provided to overcome the disadvantages of the prior art. The method enables the formation of small geometry contact bumps, which cannot be manufactured by prior art screen printing techniques. The etching method disclosed herein reduces the decomposition of $H_2O_2$, controls or maintains the temperature of the etchant mixture, and suppresses, minimizes, or reduces both the redeposition of Pb and the undercut of the entire metallization stack.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the specific chemical compositions and the specific chemical ratios are provided to facilitate the understanding of the present invention and are not provided to limit the scope of the invention. As another example, the EDTA and the DCTA of mixture 601 can be replaced by other complexing or chelating agents that have similar characteristics to those of EDTA and DCTA. Furthermore, mixture 601 can consist solely of $H_2O_2$ and DCTA or can consist solely of $H_2O_2$ and EDTA. Moreover, concentrations of $H_2O_2$ that are different from thirty percent by weight can be used in mixture 601. Accordingly, the disclosure of the present invention is not intended to be limiting. Instead, the disclosure of the present invention is intended to be illustrative of the scope of the invention, which is set forth in the following claims.

What is claimed is:

1. A method of manufacturing electronic components comprising:
   providing a first metal layer;

disposing a second metal layer overlying the first metal layer wherein the second metal layer is different from the first metal layer and wherein the second metal layer is absent over a portion of the first metal layer; and simultaneously exposing the first and second metal layers to an etchant mixture to selectively etch the first metal layer over the second metal layer wherein the etchant mixture comprises an etchant, a first additive to control the temperature of the etchant mixture, and a second additive to reduce redeposition of the second metal layer.

2. The method of claim 1 wherein providing the first metal layer further comprises selecting the first metal layer from the group consisting of tungsten and titanium.

3. The method of claim 1 wherein disposing the second metal layer further comprises selecting the second metal layer from the group consisting of lead, tin, and copper.

4. The method of claim 1 wherein simultaneously exposing the first and second metal layers further comprises providing the etchant mixture comprised of hydrogen peroxide, ethylenedinitrilo tetraacetic acid, and 1,2-cyclohexylenedinitrilo tetraacetic acid.

5. The method of claim 1 wherein simultaneously exposing the first and second metal layers further comprises providing the etchant mixture at a temperature of approximately sixty to ninety degrees Celsius.

6. A method of manufacturing electronic components comprising:

providing a semiconductor substrate;

forming a semiconductor device in the semiconductor substrate;

depositing a first metal layer comprising titanium and tungsten over the semiconductor substrate;

forming a mask layer over the first metal layer wherein the mask layer has an opening exposing a portion of the first metal layer;

depositing a second metal layer comprising a solderable metal in the opening of the mask layer and over the portion of the first metal layer;

disposing a third metal layer comprised of solder over the second metal layer;

removing the mask layer after disposing the third metal layer;

etching the first metal layer with a solution comprised of hydrogen peroxide, ethylenedinitrilo tetraacetic acid, and 1,2-cyclohexylenedinitrilo tetraacetic acid after removing the mask layer; and reflowing the third metal layer after etching the first metal layer.

7. The method of claim 6 wherein depositing the first metal layer further comprises:

providing a layer of titanium tungsten nitride over the semiconductor substrate;

providing a layer of titanium tungsten over the layer of titanium tungsten nitride; and providing a layer of copper over the layer of titanium tungsten, wherein depositing the second metal layer further comprises providing copper for the solderable metal, and wherein disposing the third metal layer further comprises:

plating the third metal layer; and providing tin and lead for the solder.

8. The method of claim 7 further comprising depositing another metal layer comprised of aluminum over the semiconductor substrate before depositing the first metal layer.

9. The method of claim 6 wherein etching the first layer further comprises:

providing ethylenedinitrilo tetraacetic acid tetrasodium salt dihydrate for the ethylenedinitrilo tetraacetic acid;

providing 1,2-cyclohexylenedinitrilo tetraacetic acid monohydrate for the 1,2-cyclohexylenedinitrilo tetraacetic acid; and selectively etching the first metal layer over the second and third metal layers.

10. The method of claim 9 wherein etching the first layer further comprises providing the solution consisting essentially of a ratio of approximately thirty-four liters of approximately thirty percent by weight of hydrogen peroxide to approximately twenty and four-tenths grams of ethylenedinitrilo tetraacetic acid tetrasodium salt dihydrate to approximately six and eight-tenths grams of 1,2-cyclohexylenedinitrilo tetraacetic acid monohydrate.

11. The method of claim 10 wherein etching the first layer further comprises providing the solution at a temperature of approximately seventy degrees Celsius.

\* \* \* \* \*